(12) United States Patent
Kagaya et al.

(10) Patent No.: US 7,130,100 B2
(45) Date of Patent: Oct. 31, 2006

(54) OPTICAL MODULE

(75) Inventors: Osamu Kagaya, Tokyo (JP); Noriko Sasada, Yokohama (JP); Kazuhiko Naoe, Yokohama (JP)

(73) Assignee: Opnext Japan, Inc., Yokohama (JP)

( * ) Notice: Subject to any disclaimer, the term of this patent is extended or adjusted under 35 U.S.C. 154(b) by 16 days.

(21) Appl. No.: 11/131,309

(22) Filed: May 18, 2005

(65) Prior Publication Data

US 2006/0007516 A1   Jan. 12, 2006

(30) Foreign Application Priority Data

Jul. 12, 2004   (JP) ............................. 2004-204143

(51) Int. Cl.
- *G02F 1/00* (2006.01)
- *G02F 1/03* (2006.01)
- *G02B 6/36* (2006.01)
- *G02B 6/12* (2006.01)
- *H04B 10/04* (2006.01)

(52) U.S. Cl. ...................... 359/237; 359/245; 359/248; 385/14; 385/92; 398/182; 372/26; 372/38.01; 333/32

(58) Field of Classification Search ................ 359/237, 359/245, 248, 240; 385/14, 88, 92; 398/182, 398/183, 187, 200; 372/26, 33, 38.01; 333/32, 333/168; 324/95, 601, 753; 257/563
See application file for complete search history.

(56) References Cited

U.S. PATENT DOCUMENTS

| | | | | |
|---|---|---|---|---|
| 3,132,313 | A | * | 5/1964 | Alford .......................... 333/32 |
| 3,408,542 | A | * | 10/1968 | Mitchell et al. ............. 257/563 |
| 4,298,846 | A | * | 11/1981 | Hirano et al. ................. 333/32 |
| 4,945,542 | A | * | 7/1990 | Brothers, Jr. ................ 372/26 |
| 5,602,672 | A | | 2/1997 | Ishimura et al. |
| 5,930,022 | A | * | 7/1999 | Okuma ........................ 359/248 |
| 5,990,747 | A | * | 11/1999 | Chaki et al. ................. 330/286 |
| 6,044,097 | A | * | 3/2000 | Kawamura et al. ...... 372/38.01 |
| 6,323,986 | B1 | * | 11/2001 | Lee et al. .................... 359/248 |
| 6,437,899 | B1 | * | 8/2002 | Noda .......................... 359/245 |
| 6,628,176 | B1 | * | 9/2003 | Okada .......................... 333/32 |
| 6,735,353 | B1 | * | 5/2004 | Hirata et al. .................. 385/14 |
| 6,823,145 | B1 | * | 11/2004 | Shirai et al. ................ 398/182 |

(Continued)

FOREIGN PATENT DOCUMENTS

JP   2001-308130   11/2001

OTHER PUBLICATIONS

Shirai, M., et al., "40 Gbit/s electroabsorption modulators with impedance-controlled electrodes", Electronics Letters, IEE Stevenage, GB, vol. 39, No. 9, May 1, 2003, pp. 733-735.

(Continued)

*Primary Examiner*—Loha Ben
(74) *Attorney, Agent, or Firm*—Mattingly, Stanger, Malur & Brundidge, P.C.

(57) ABSTRACT

Even for a driving impedance of 25 Ω, high transmission waveform quality of an optical transmission module is maintained using an optical modulator element designed for a driving impedance of 50 Ω. The above can be achieved by adopting an optical module 100 that includes an input electrode for electrical signals, an optical modulator element for modulating laser light using the electrical signals, a termination resistance element, a first bonding wire for connecting the input electrode and the optical modulator element, a second bonding wire for connecting the optical modulator element and the termination resistance element, and a third bonding wire for connecting the input electrode and the termination resistance element.

13 Claims, 11 Drawing Sheets

U.S. PATENT DOCUMENTS

| | | | |
|---|---|---|---|
| 7,011,458 B1 * | 3/2006 | Kagaya et al. | 385/92 |
| 2003/0102157 A1 | 6/2003 | Rosenberg et al. | |
| 2004/0001242 A1 | 1/2004 | Shigeta et al. | |

OTHER PUBLICATIONS

ASIP 1310 nm EML TOSA.

* cited by examiner

OPTICAL MODULE

CROSS-REFERENCES TO RELATED APPLICATIONS

This application relates to Japanese patent application serial no. 2004-317752, filed on Nov. 1, 2004, entitled "Optical Module" the content of which are incorporated herein by reference.

Claim of Priority

The present application claims priority from Japanese patent application serial no. 2004-204143, filed on Jul. 12, 2004, the content of which is hereby incorporated by reference into this application.

BACKGROUND OF THE INVENTION

The present invention relates to optical modules for optical communications, and more particularly, to optical modules suitable for 25-Ω driving.

The optical communications modules using a semiconductor laser are one of the key devices in transceivers for optical-fiber transmission. Along with the proliferation of broadband networks in recent years, optical communications modules have been speeded up and types up to 10 Gbits/s in bit rate are coming to be most commonly used. Optical communications modules suitable for the above applications are required to be more compact and less expensive as well as to achieve higher transmission waveform quality.

Japanese Patent Laid-Open No. 2001-308130 describes a module that simultaneously ensures the retention of a 3-dB band in the small-signal passage characteristics (S21) of the optical modulator of a modulator-integrated light source unit and reduction in the small-signal reflection characteristics (S11) of the modulator. The above module is realized by properly conditioning the relationship in inductance between a first bonding wire for connecting the modulator and signal line of the modulator-integrated light source unit, and a second boding wire for connecting the modulator and a matching resistor.

Also, the "ASIP 1310 nm EML TOSA", a pamphlet of ASIP Inc., lists electroabsorption laser modules mounted in the CAN-type packages having a driving impedance of 50 Ω (ohms) and a termination resistance of 100 Ω.

Packages of the CAN type are in need for further reduction in the dimensions of optical communications modules.

When the CAN type of package is used, the output impedance of a driving IC and the impedance of the transmission line between the driving IC and the package must be adjusted to a 20 Ω–30 Ω range to obtain better transmission waveforms. The reason is described below. The CAN-type package has its lead pins hermetically sealed with glass and fixed, and a coaxial line is formed between the sealed sections. The characteristic impedances of these sealed sections usually range from 20 Ω to 30 Ω. Waveform deterioration due to multipath reflection can be avoided by matching the impedance of a driving signal route accurately with the impedance of each hermetically sealed section.

To perform modifications for a driving impedance of 25 Ω in Japanese Patent Laid-Open No. 2001-308130, uniform waveform quality can, in principle, be achieved by scaling, i.e., by halving the resistance value of the matching resistor 4, halving the inductances of the first and second bonding wires 5 and 6, and doubling the capacity value of the optical modulator 10. Almost all optical modules currently in use, however, are designed with a driving impedance of 50 Ω. If the original capacity of the optical modulator element in the modulator-integrated semiconductor laser chip of an optical module designed with a driving impedance of 50 Ω is doubled, waveform quality deterioration due to a decrease in frequency band will result since a sufficient band will not be obtainable.

Additionally, according to studies by the inventors, changing the driving impedance to 25 Ω, the termination resistance value to 25 Ω, and the inductances of both bonding wires 5 and 6 to ½, by using the conventional modulator-integrated semiconductor laser chip (suitable for 50-Ω driving) that does not increase the capacity value of its optical modulator, causes great peaking of the frequency characteristics in small-signal passage characteristics S21, thus deteriorating transmission waveform quality. As described above, with existing technologies, high waveform quality has not been achievable at a driving impedance of 25 Ω by using a modulator-integrated semiconductor laser chip designed with a driving impedance of 50 Ω.

This means that some other different type of modulator-integrated semiconductor laser must be designed and manufactured for use at a driving impedance of 25 Ω. In view of design and development expenses, production management expenses, and the like, however, this means increases in the costs of modulator-integrated semiconductor laser chips. The development of such a different type of modulator-integrated semiconductor laser needs to be avoided to obtain more compact, less expensive CAN-type optical transmission modules.

SUMMARY OF THE INVENTION

A point of the present invention exists in an optical module that includes: an input electrode for input electric signals; an optical modulator element for modulating laser light using the input electric signals; a termination resistance element for impedance matching; a first bonding wire for connecting the input electrode and the optical modulator element; a second bonding wire for connecting the optical modulator element and the termination resistance element; and a third bonding wire for connecting the input electrode and the termination resistance element.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Embodiments of the present invention will now be described with reference to the drawings.

(First Embodiment)

Figure 1:
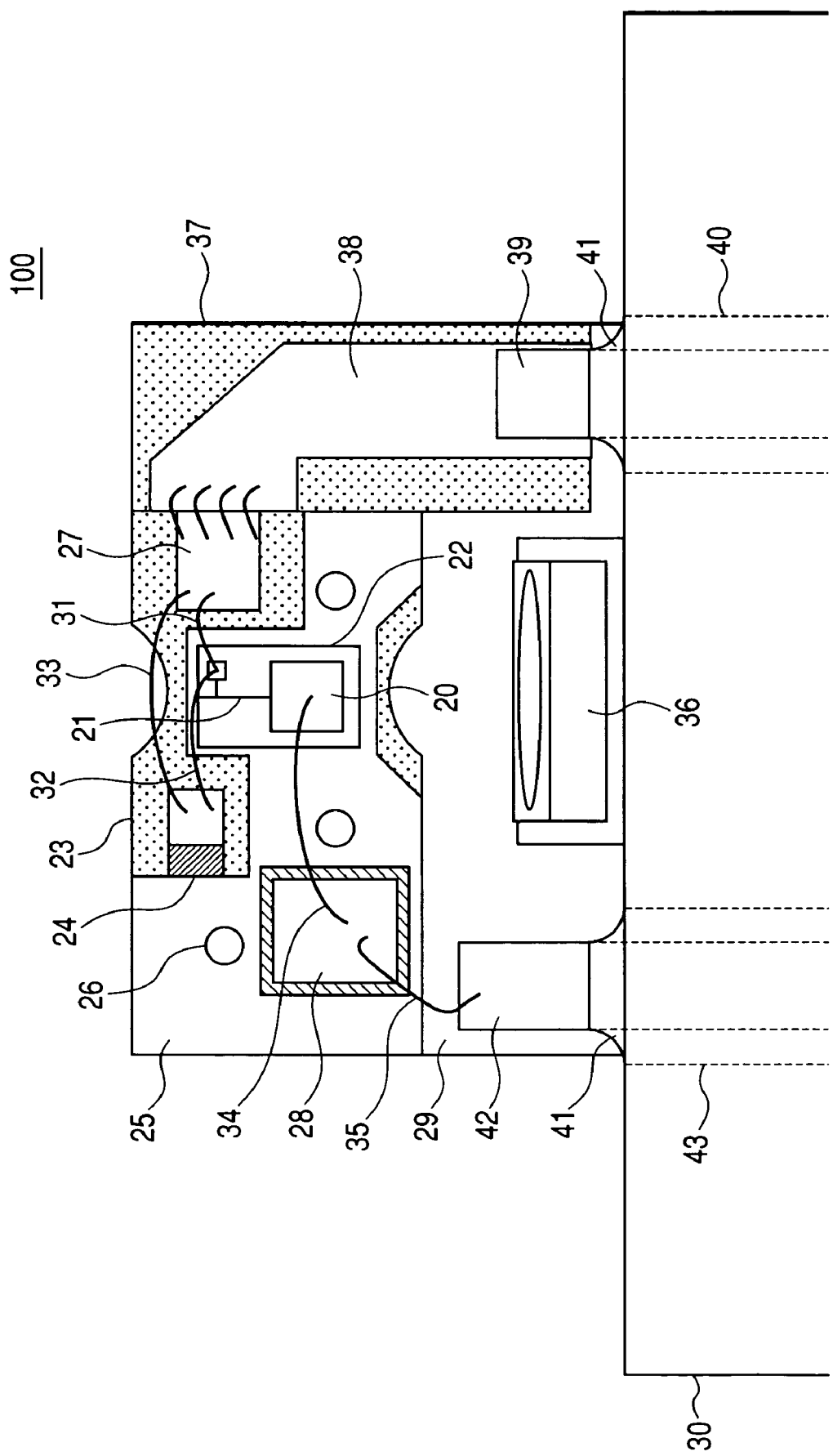
FIG. 1 is a plan view showing major sections of an optical transmission module which is a first embodiment of the present invention.
Figure 2:
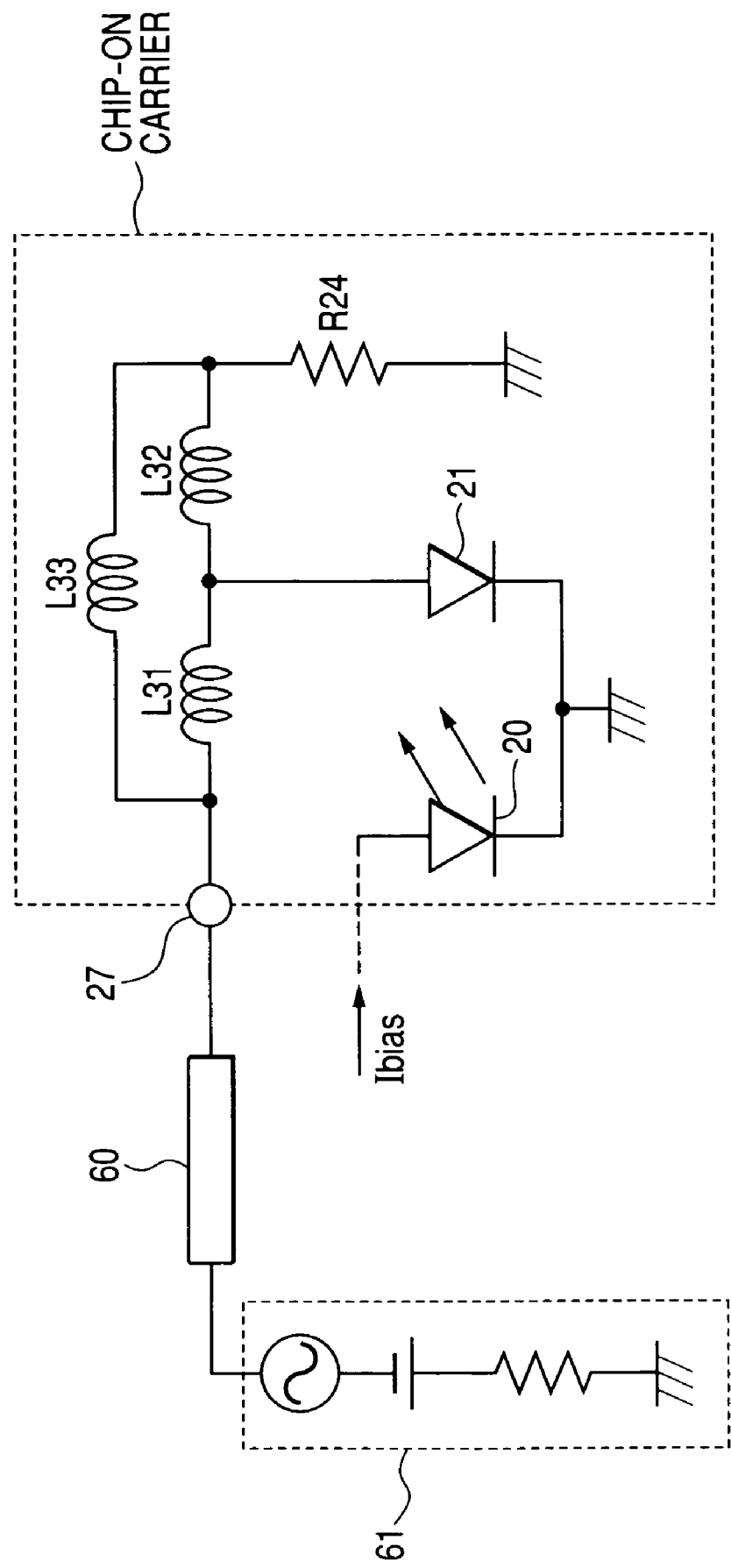
FIG. 2 is a main circuit diagram of the optical transmission module which is the first embodiment of the present invention.
Figure 3:
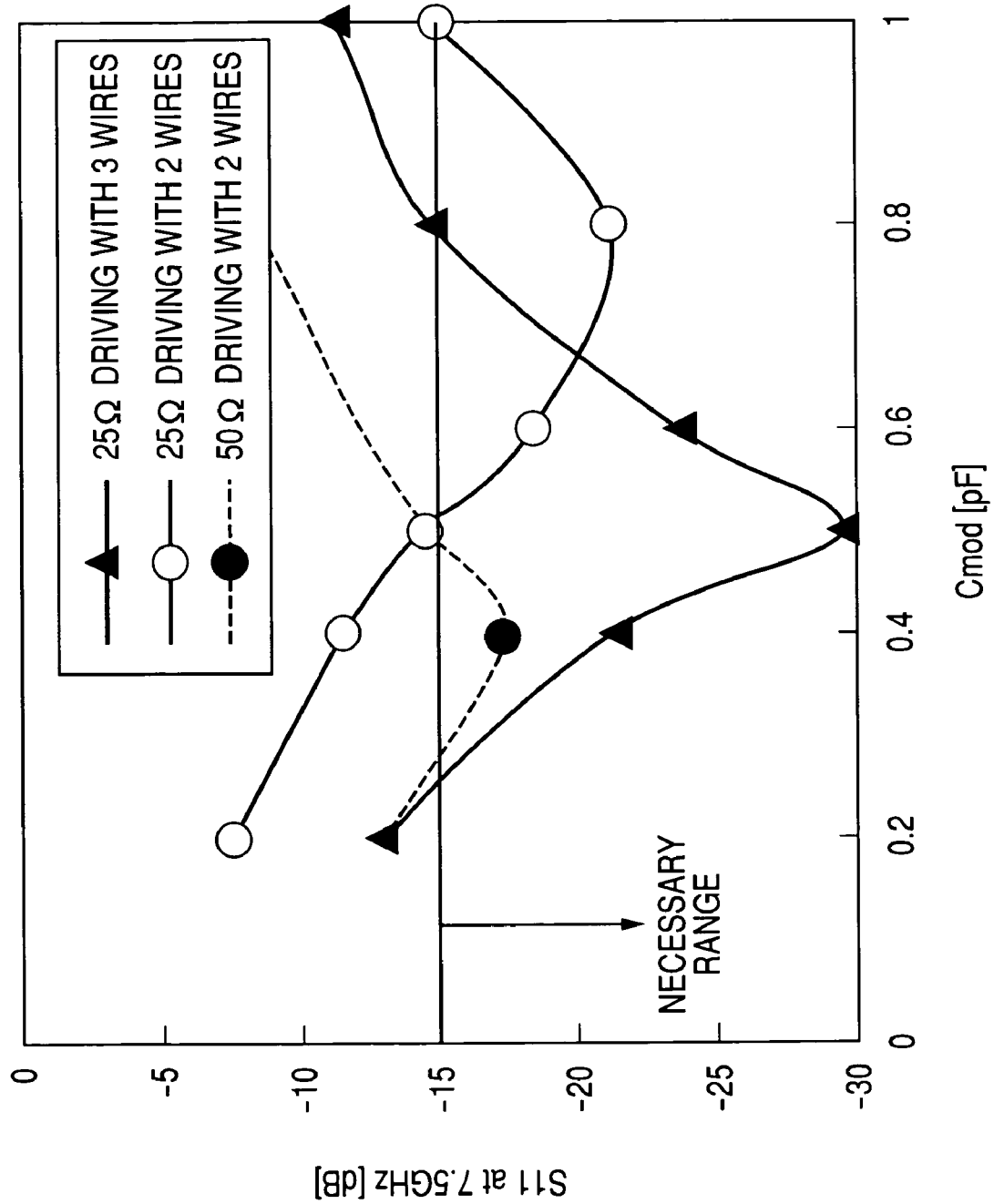
FIG. 3 is an explanatory diagram of the first embodiment of the present invention, showing the relationship between a capacity of an optical modulator and a reflection coefficient at 7.5 GHz.
Figure 4:
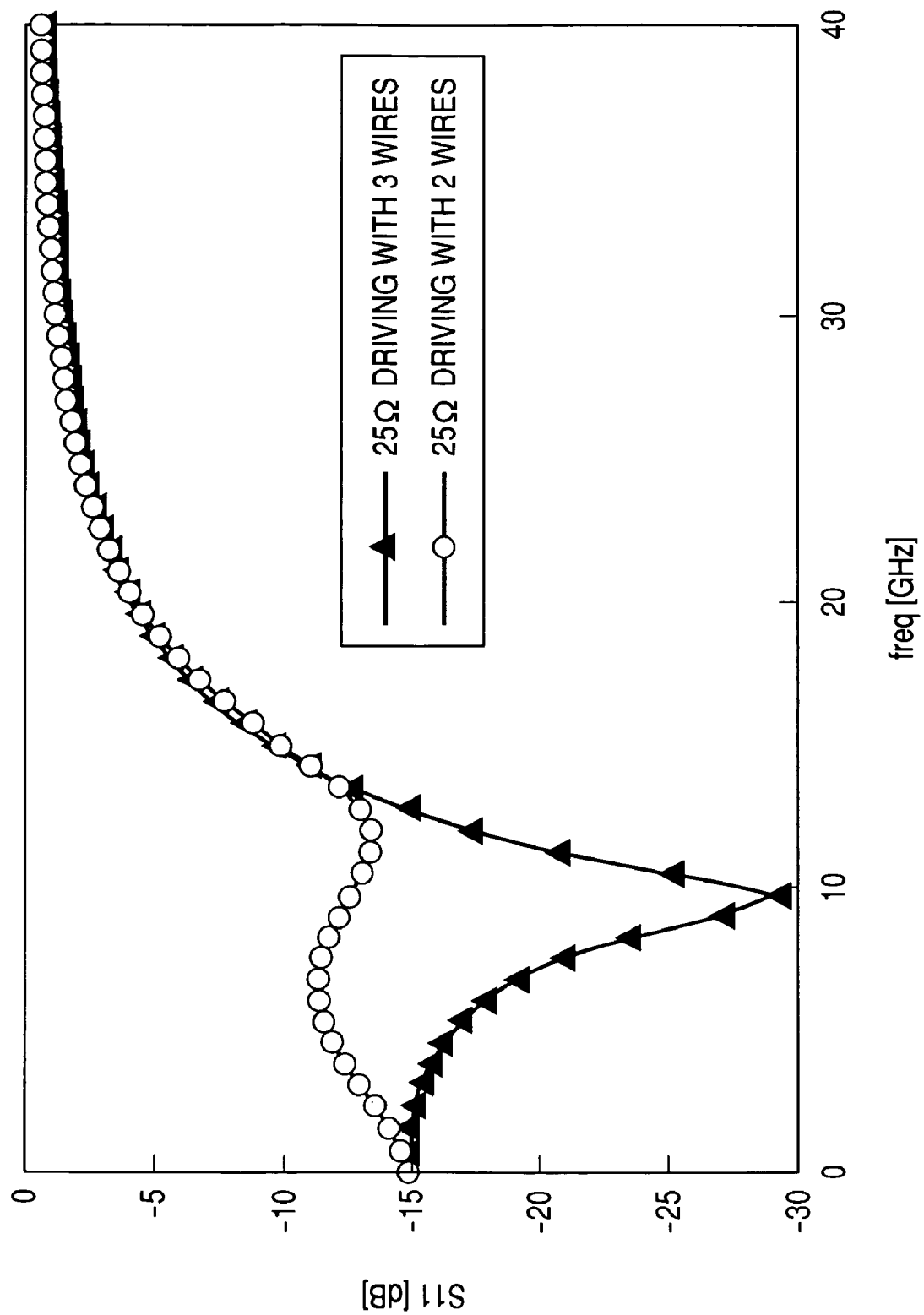
FIG. 4 is another explanatory diagram of the first embodiment of the present invention, showing frequency dependence of the reflection coefficient.
Figure 5:
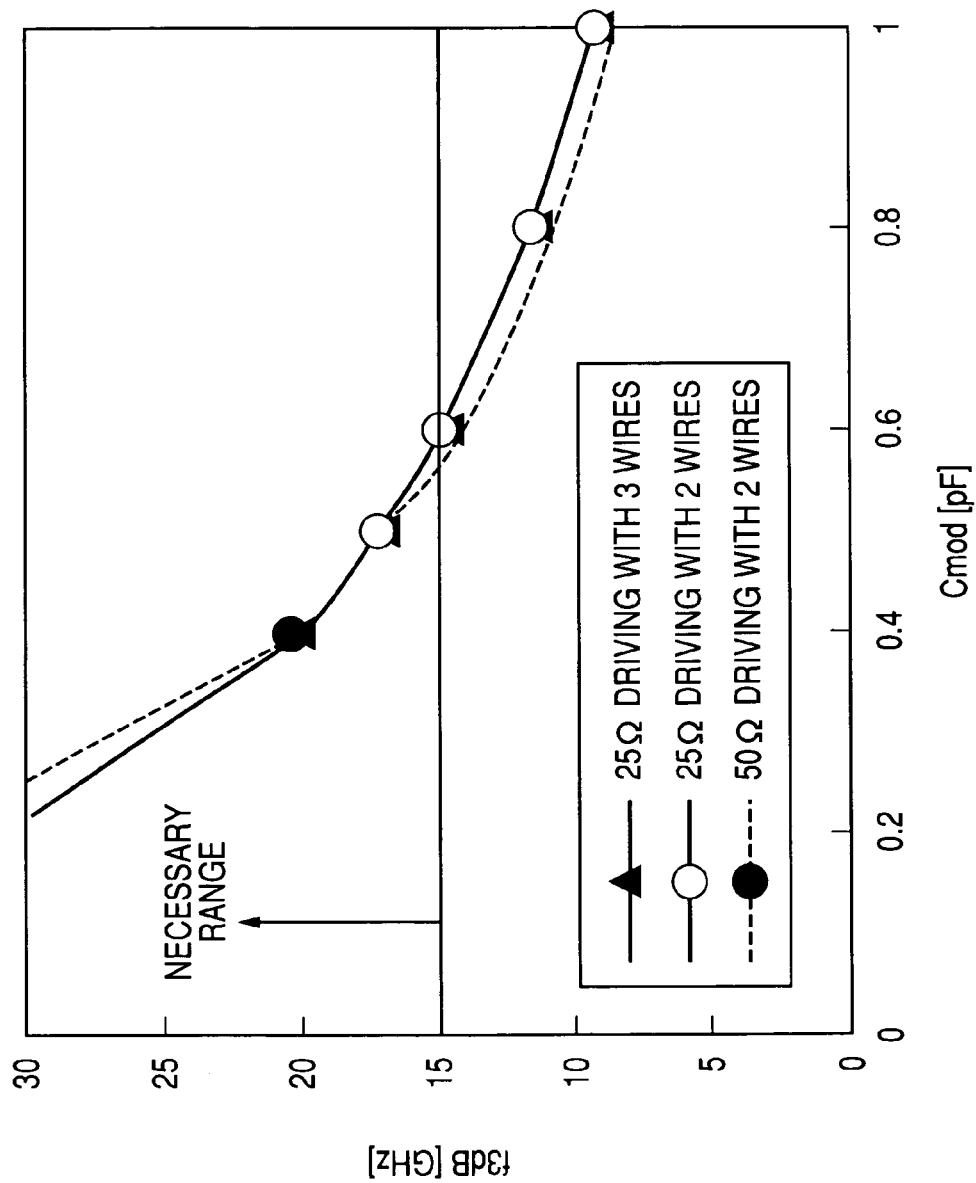
FIG. 5 is yet another explanatory diagram of the first embodiment of the present invention, showing the relationship between the capacity of the optical modulator and a 3-dB band in electro-optical signal passage characteristics (S21)
Figure 6:
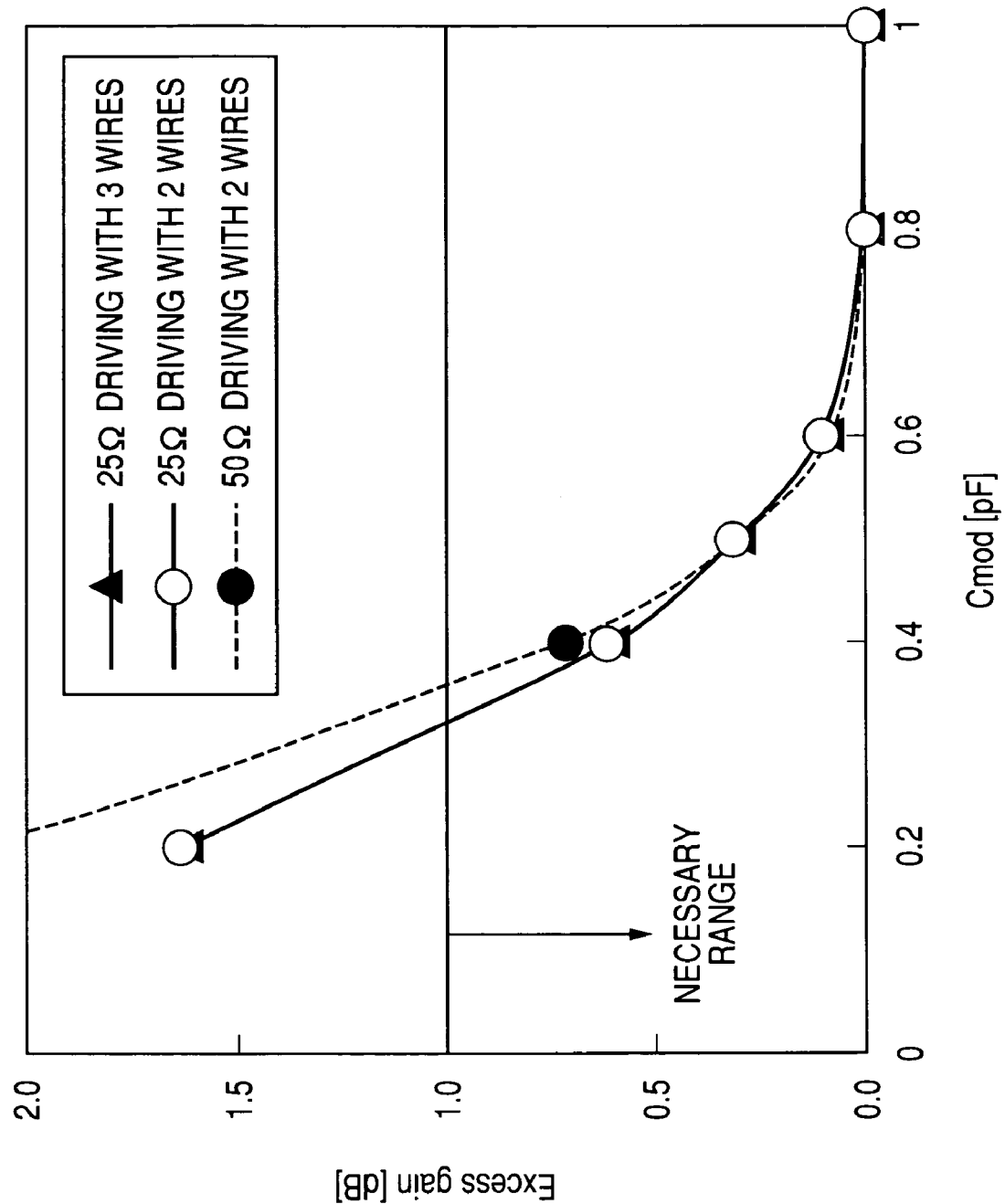
FIG. 6 is a further explanatory diagram of the first embodiment of the present invention, showing the relationship between the capacity of the optical modulator and excess gain characteristics.
Figure 7:
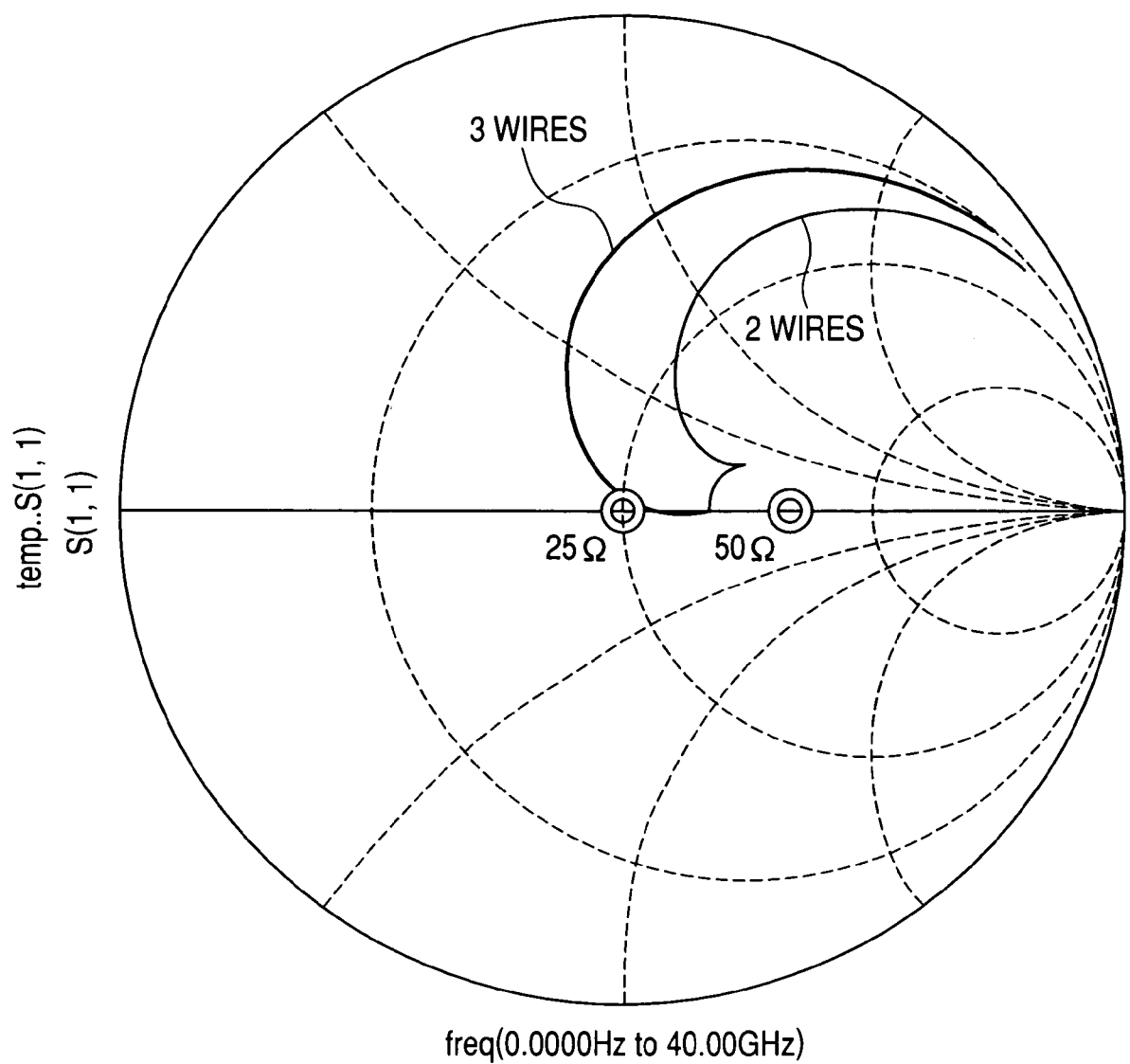
FIG. 7 is a Smith chart explaining the first embodiment of the present invention with characteristic impedance $Z_0$ taken as 25 Ω.
Figure 8:
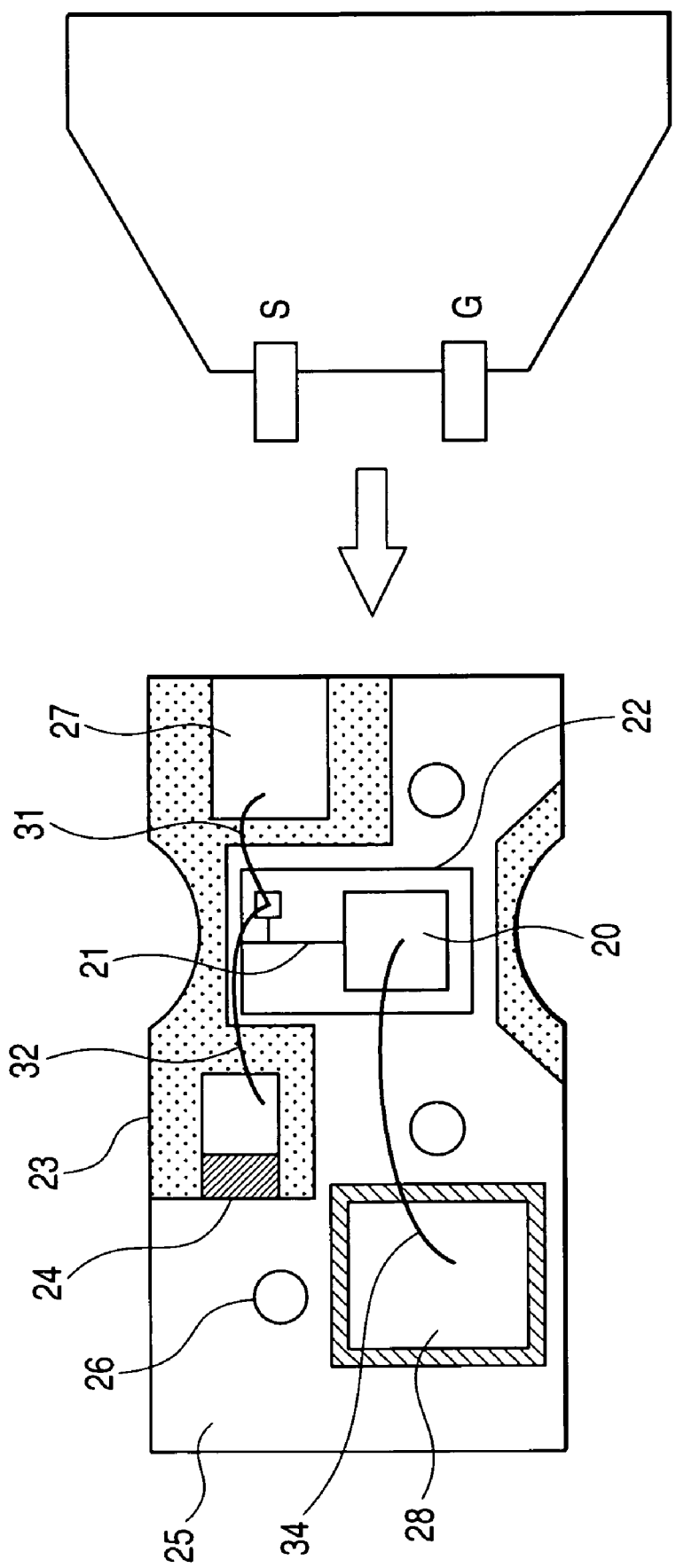
FIG. 8 is a plan view showing a chip-on carrier of the modulator-integrated semiconductor laser chip used in the first embodiment of the present invention.
Figure 9:
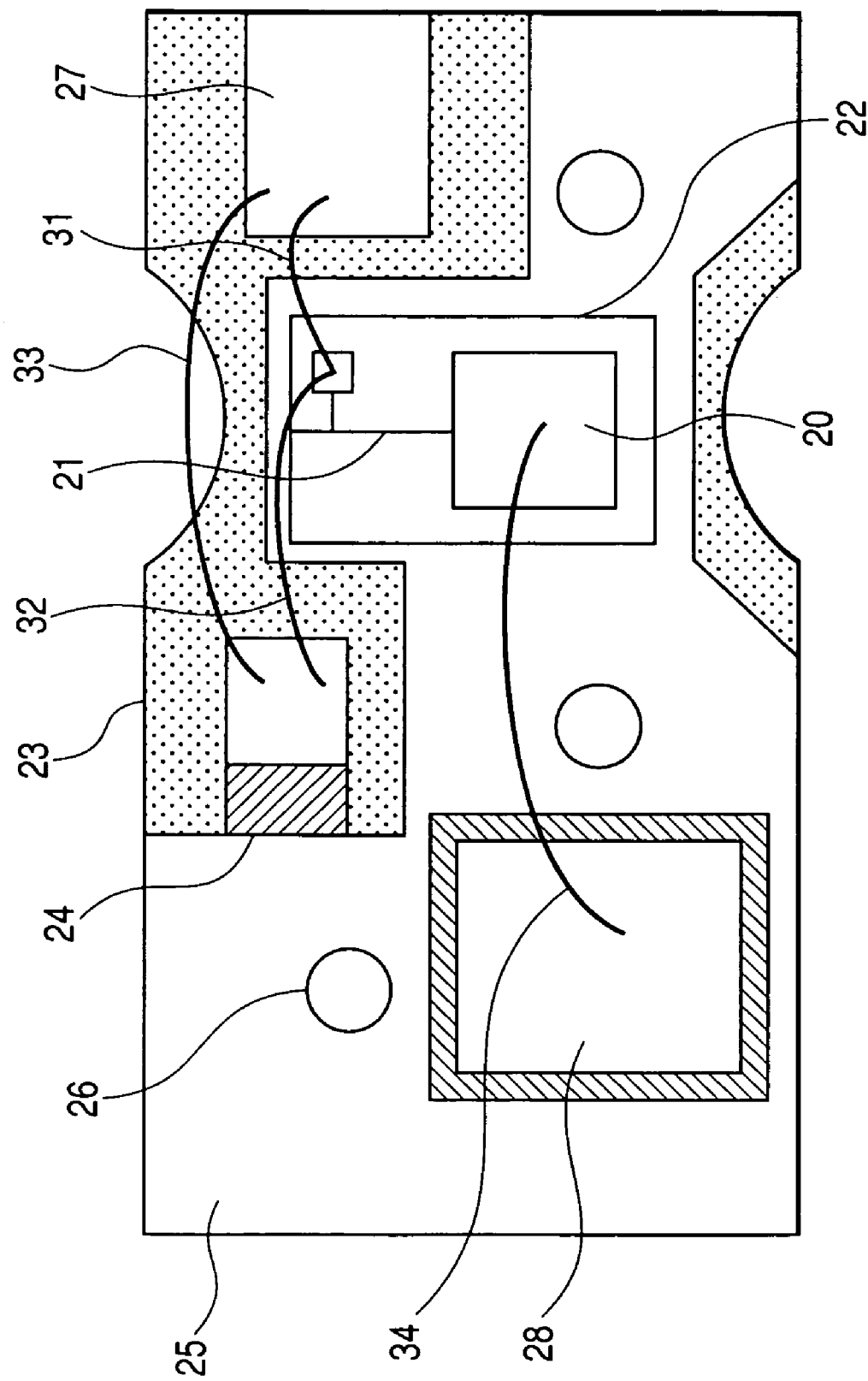
FIG. 9 is a plan view showing a modified chip-on carrier of the modulator-integrated semiconductor laser chip used in the first embodiment of the present invention.

A first embodiment of the present invention will be described below using FIGS. 1 to 9. FIG. 1 is a plan view showing major sections of an optical transmission module which is the first embodiment of the present invention. FIG. 2 is a circuit diagram of major sections and driving sections of the optical transmission module which is the first embodiment of the present invention. FIG. 3 is an explanatory diagram of the first embodiment of the present invention, showing the relationship between a capacity of an optical modulator and a reflection coefficient at 7.5 GHz. FIG. 4 is another explanatory diagram of the first embodiment of the present invention, showing frequency dependence of the reflection coefficient. FIG. 5 is yet another explanatory diagram of the first embodiment of the present invention, showing the relationship between the capacity of the optical modulator and a 3-dB band in electro-optical signal passage characteristics (S21). FIG. 6 is a further explanatory diagram of the first embodiment of the present invention, showing the relationship between the capacity of the optical modulator and excess gain characteristics. FIG. 7 is a Smith chart explaining the first embodiment of the present invention with characteristic impedance $Z_0$ taken as 25 Ω. FIGS. 8 and 9 are plan views each showing a different chip-on carrier of a modulator-integrated semiconductor laser chip used in the first embodiment of the present invention.

First, a configuration of the optical transmission module will be described using FIG. 1. Optical transmission module 100 uses a CAN type of package as its enclosure, whose metallic stem is denoted as 30 and whose metallic mount for mounting the major sections of the module is denoted as 29. The metallic stem 30 has cylindrical lead pins 39, 42 through which cylindrical through-holes 40, 43, respectively, are passed, and the lead pins are fixed to respective sealing glass members 41. A relay substrate 37 and a carrier substrate 23 are mounted on the metallic mount 29. A transmission line 38 is provided on the relay substrate 37. A resistance element 24, a grounding metal 25, and an input electrode 27 are each patterned on the surface of the carrier substrate 23, and the grounding metal 25 connects to a reverse-side electrode of the carrier substrate 23 by means of VIA holes 26. A semiconductor chip 22 and a bypass capacitor 28 are also mounted on the carrier substrate 23.

The semiconductor chip 22 is a modulator-integrated semiconductor laser chip having, on its surface, a semiconductor laser diode element 20 and an optical modulator element 21. The continuous laser light output from the semiconductor laser diode 20 is passed through the optical modulator element 21 and then emitted to an optical fiber via a coupling lens not shown. The modulator element 21 modulates the continuous laser light into optical modulation signals using the 10-Gbits/s electrical modulation signals sent from an external driving IC. A route from the semiconductor laser diode element 20 to the optical fiber (not shown) is called "optical axis." The input electrode 27 and the resistance element 24 are arranged at sides opposite to each other across the optical axis.

On the metallic stem 30 is provided a monitoring photodiode 36, which is fixed to a position where it can receive the light output rearward from the semiconductor laser diode element 20. A first bonding wire 31 connects the input electrode 27 and the optical modulator element 21, and a second bonding wire 32 connects the optical modulator element 21 and the resistance element 24. A third bonding wire 33 connects the input electrode 27 and the resistance element 24. The input electrode 27 and the transmission line 38 on the carrier substrate 23 are connected by a ribbon wire or the like at low inductance. The transmission line 38 and the lead pin 39 are bonded to each other with an AuSn alloy. In this way, an electric signal input route from the lead pin 39 to the optical modulator element 21 is constructed. The semiconductor laser diode element 20 connects to the lead pin 42 via power-feeding bonding wires 34, 35, from which direct-current power is supplied.

The CAN-type package enclosure is a 5.6-mm-diameter TO-56 type of enclosure. The metallic stem 30 and the metallic mount 29 are both made of inexpensive iron to reduce costs. The relay substrate 37 and the carrier substrate 23 are constructed using a dielectric material such as alumina or aluminum nitride. Use of aluminum nitride high in heat conductivity for the carrier substrate 23 makes this substrate suitable for suppressing increases in element temperature, since it reduces the thermal resistance transmitted from the semiconductor chip 22 to the metallic mount 29. Also, the carrier substrate 23 may be constructed by laminating a dielectric substrate made of aluminum nitride, for example, and a metallic plate made of a copper-tungsten alloy or the like. Construction of the carrier substrate 23 in this way makes the substrate 23 suitable for further lowering the thermal resistance. The resistance element 24 is constructed of a tantalum nitride film and adjusted by laser trimming to obtain a resistance value of 50 Ω. The semiconductor chip 22 uses an "n"-type InP substrate, on the surface of which are formed the semiconductor laser diode element 20 that is a distributed feedback laser diode (DFB-LD), and the optical modulator element 21 that is an electroabsorption modulator (EAM). Respective anodic electrodes of the semiconductor laser diode element 20 and the optical modulator element 21 are also provided on the chip surface. If a wire is interposed between the first bonding wire 31 and the second bonding wire 32 to form one linear continuous wire with the anodic electrode of the optical modulator element 21 as a relay point, the formation is preferred for reduction in element capacity, Cmod, since the anodic electrode of the optical modulator element 21 can be minimized in area. More specifically, the formation can be realized by ball-bonding the input electrode 27, next bonding one end of the continuous wire without cutting it at the anodic electrode of the optical modulator element 21, then bonding the other end of the wire at the resistance element 24, and finally, cutting the wire. This procedure may be reversed.

The reverse-side electrode of the semiconductor chip 22 is used as a cathodic electrode common to the semiconductor laser diode element 20 and the optical modulator element 21. An output from the monitoring photodiode 36 is sent out through any other lead pin (not shown). For dimensional reduction, it is preferable that the bypass capacitor 28 be of the parallel plate type constructed as a single-layer, highly dielectric substrate.

Next, circuit composition will be described using FIG. 2. First, an electrical modulation signal that a driving IC 61 has output is input to the input electrode 27 of the carrier substrate 23 through a transmission line 60. The driving IC 61 assumes an output impedance of 25 Ω. The transmission line 60 includes a transmission line formed on a printed substrate which has the driving IC 61 mounted thereon, a transmission line formed on a flexible substrate which connects the printed substrate and the lead pin 39, a coaxial line formed up of the through-hole 40, the lead pin 39, and the appropriate sealing glass member 41, and a transmission line 38 provided on the relay substrate 37. Respective characteristic impedances of these lines are united to 25 Ω. Symbol R24 denotes a resistance value of the resistance element 24, and symbols L31, L32, L33 denote inductance values of the first, second, and third bonding wires 31, 32, 33 respectively. The electrical modulation signal is input to an anode of the optical modulator element 21 via the above circuit elements. A cathode of the optical modulator element 21 is electrically grounded. A forward DC current is supplied as an Ibias current from an external circuit to the semiconductor laser diode element 20, which then outputs laser light. Since an inverse bias is usually applied to an electroabsorption modulator to operate it, the present embodiment uses both a −5.2-V negative power supply, and a +3.3-V positive power supply for the laser element.

In the present embodiment: Cmod is 0.4 pF; L31, 0.4 nH; L32, 0.8 nH; L33, 1.2 nH; and R24, 50 Ω.

Next, characteristics of the optical transmission module according to the present embodiment will be described using FIGS. 3 to 7.

As shown in FIG. 3, although two-wire driving described in Japanese Patent Laid-Open No. 2001-308130 causes the deterioration of characteristics in reflection coefficient S11 during 25-Ω driving, the reflection coefficient characteristics are significantly improved by adding a third bonding wire. In terms of the frequency dependence of reflection coefficient S11, shown in FIG. 4, adding the third bonding wire also improves the reflection coefficient in a wide frequency range from 0 (DC) to 12 GHz, thus yielding an effect that suppresses the reflection coefficient to −15 dB or less. In addition, as shown in FIGS. 5 and 6, sufficient characteristics are exhibited in terms of both 3-dB band characteristics and excess gain characteristics. This indicates that characteristics suitable for an optical transmission module with a driving impedance of 25 Ω are obtainable by adding the third bonding wire. According to FIGS. 3, 5, and 6, appropriate element capacity, Cmod, of the optical modulator ranges from 0.35 pF to 0.60 pF.

The way the effect of suppressing reflection coefficient S11 by adding the third bonding wire is yielded will be described using FIG. 7. FIG. 7 is a Smith chart assuming 25 Ω as characteristic impedance $Z_0$. The changes in reflection coefficient S11 that actually observed before and after the third bonding wire was added are shown as respective paths on the Smith chart. In conventional methods (2 WIRES combined with display), for an impedance-matching termination resistance of 50 Ω at a driving impedance of 50 Ω, a T-type matching circuit has been constructed using a series element formed of a first bonding wire, a shunting element formed of a capacitive optical modulation element, and a series element formed of a second bonding wire, and each such element has been parameterized for as-essentially-desired matching characteristics to be obtained at frequencies near 7.5 GHz. Consequently, as shown in FIG. 7, the path of S11 approaches a position of 50 α at a frequency near 7.5 GHz, and after looping, the path moves away from the 50-Ω position. This loop is apart from a position of 25 Ω, and this fact is associated with the deterioration of reflection coefficient S11. In the present embodiment, the T-type matching circuit composition is changed by adding the third bonding wire to make the 50-Q termination resistor directly visible from the input side of the matching circuit through the third bonding wire. The present inventors have conducted such a change to find that as shown in FIG. 7, the loop created by the path of S11 disappears, and thus that the path can be changed to approach the 25-Q position in the neighborhood of the 7.5-GHz frequency. Thus, as described above, a significant improvement effect over the effect obtainable using the conventional methods can be obtained.

According to the construction of the present first embodiment, characteristics suitable for an optical transmission module with a driving impedance of 50 Ω are already obtainable in the chip-on-carrier state (shown in FIG. 8) that exists before the third bonding wire is added. More specifically, these characteristics can be obtained by changing the element capacity (Cmod) of the optical modulator element 21 to 0.4 pF, inductance L31 of the first bonding wire to 0.4 nH, inductance L32 of the second bonding wire to 0.8 nH, and termination resistance value R24 to 50 Ω. A reflection coefficient (S11) at 7.5 GHz is shown in FIG. 3, a 3-dB band in electro-optical signal passage characteristics S21 is shown in FIG. 5, and element capacity dependence of an excess gain in the band of S21 is shown in FIG. 6. These figures indicate that the data ranges employed by the present inventors as a measure of the characteristics that provide high transmission waveform quality can be satisfied for 50-Ω driving.

The chip-on-carrier state mentioned above refers to a state in which electrical evaluations can be performed with the semiconductor chip 22 mounted on the carrier substrate 23.

To accurately measure radio-frequency characteristics of the chip-on-carrier that has been adjusted for 25-Ω driving, a special evaluation system assuming a characteristic impedance of 25 Ω needs to be used, which requires a great deal of expense and time for construction of a measuring system. According to the construction of the first embodiment, radio-frequency characteristics (S11, S21, chirp parameters, and others) can be analyzed with an evaluation system of a normal 50-Ω characteristic impedance by connecting a radio-frequency probe unit to both the input electrode 27 and a grounded electrode 25, in the 50-Ω driving chip-on-carrier state shown in FIG. 8. After that, the third bonding wire 33 is added for modification into the 25-Ω driving chip-on-carrier shown in FIG. 9. This has an advantage in that chip-on-carrier characteristics can be screened/classified with a normal 50-Ω measuring system.

Thus, according to the first embodiment, an optical transmission module that can maintain high transmission waveform quality for a driving impedance of 25 Ω can be provided by adding one bonding wire to a circuit designed for a driving impedance of 50 Ω. The addition also makes it possible to provide an optical transmission module that contains a CAN-type package.

While the above first embodiment assumes that the resistance element 24 has a resistance value of 50 Ω, this value may range from 40 to 60 Ω, depending on factors such as adaptability to the driving IC. Also, while FIG. 2 assumes that the driving IC 61 has an output impedance of 25 Ω, this value may range from 20 to 30 Ω. In addition, while it is assumed that the coaxial line formed up of the through-hole 40, the lead pin 39, and the appropriate sealing glass member 41, has a characteristic impedance of 25 Ω, this value may range from 20 to 30 Ω, depending on particular shapes of these members and on the type of glass material selected for sealing. Furthermore, along with these, other transmission lines constituting the transmission line 60 may range from 20 to 30 Ω in characteristic impedance. The matching resistor/resistance is also called a termination resistor/resistance.

While the optical modulator in the above-described first embodiment is integrated with a laser diode, an independent optical modulator module may be used instead. Both the optical transmission module and the optical modulator module are simply called "optical modules." A module with a driving IC and/or other peripheral circuits added to the optical transmission module in the first embodiment is also an optical module.

(Second Embodiment)

Figure 10:
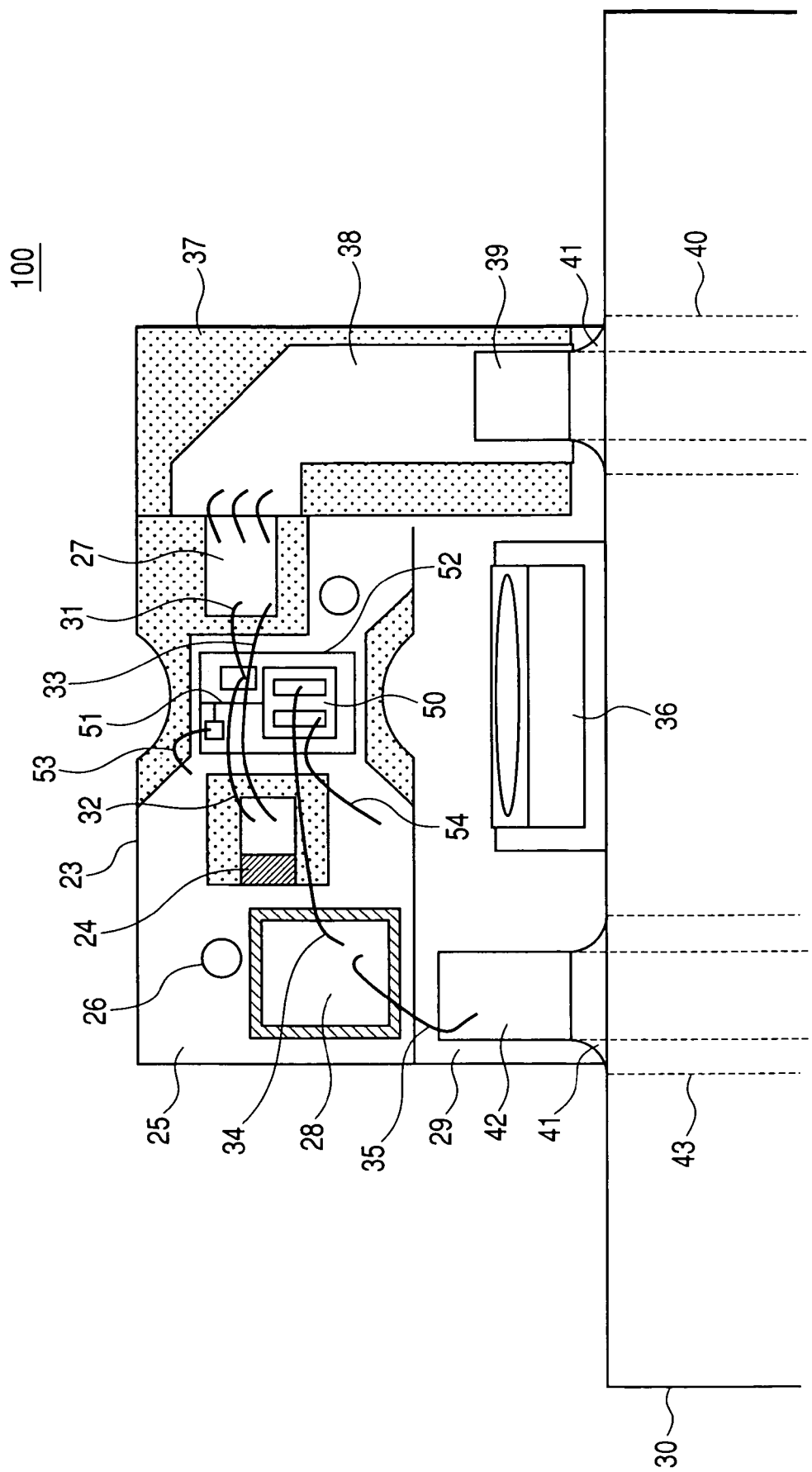
FIG. 10 is a plan view showing major sections of another optical transmission module which is a second embodiment of the present invention.
Figure 11:
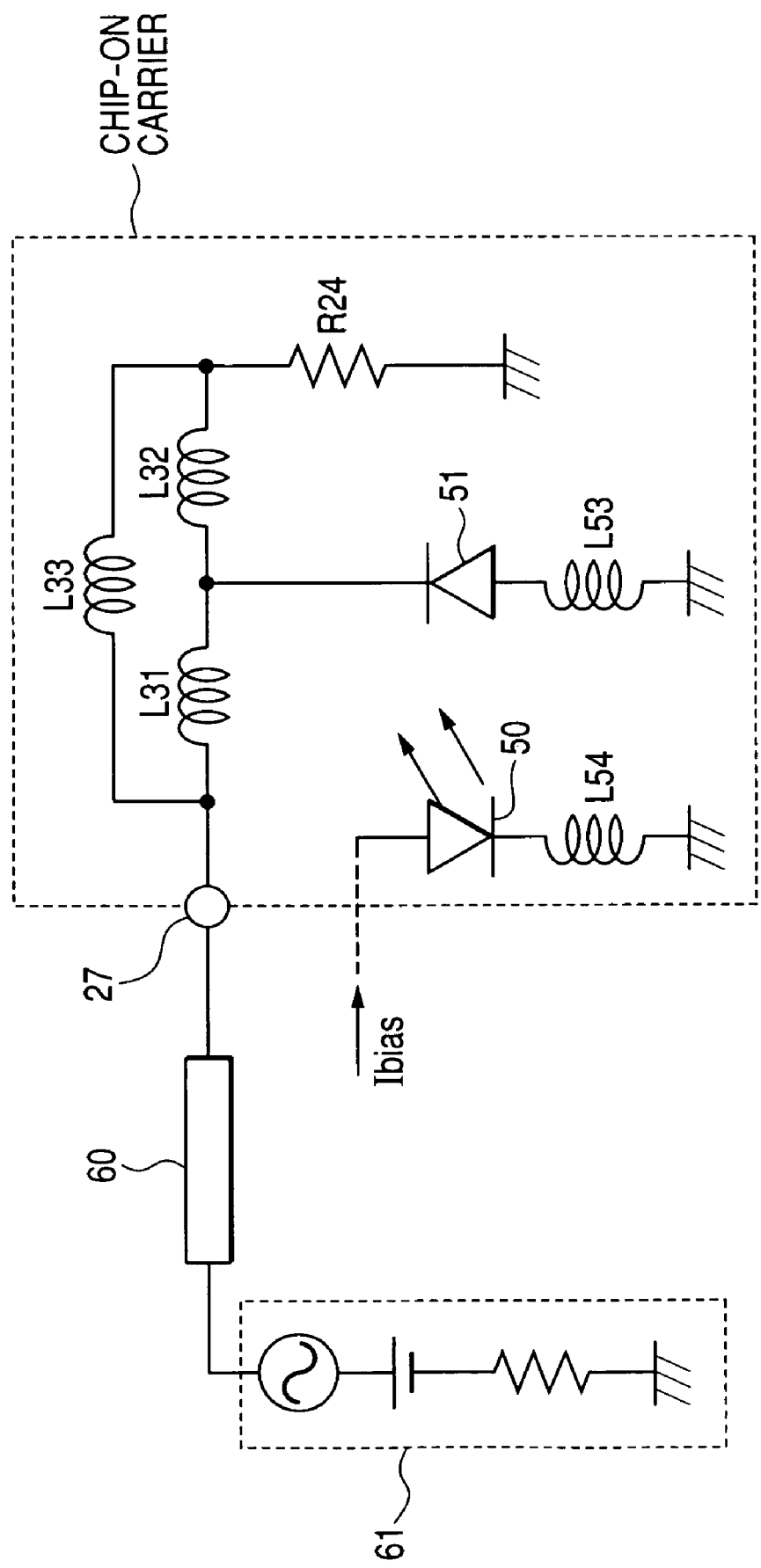
FIG. 11 is a main circuit diagram of the optical transmission module which is the second embodiment of the present invention.

A second embodiment of the present invention will be described below using FIGS. 10 and 11. FIG. 10 is a plan view showing major sections of an optical transmission module which is the second embodiment of the present invention. FIG. 11 is a circuit diagram of the major sections and driving section of the optical transmission module which is the second embodiment of the present invention.

First, a configuration of the optical transmission module will be described using FIG. 10. The second embodiment differs from the first embodiment in that a semiconductor chip 52 formed of a semi-insulated InP substrate is used as a modulator-integrated semiconductor laser chip. A semiconductor laser diode element 50 and an optical modulator element 51 are provided on the surface of the semiconductor chip 52. An anodic electrode and cathodic electrode of the semiconductor laser diode element 50, and an anodic electrode and cathodic electrode of the optical modulator element 51 are also provided on the chip surface. A first bonding wire 31 connects an input electrode 27 and the cathodic electrode of the optical modulator element 51, and a second bonding wire 32 connects the cathodic electrode of the optical modulator element 51 and a resistance element 24. A third bonding wire 33 connects the input electrode 27 and the resistance element 24. A low-inductance element connects the anodic electrode of the optical modulator element 51 and a grounding electrode 25 via a bonding wire 53. The cathodic electrode of the semiconductor laser diode element 50 connects to the grounding electrode 25 via a bonding wire 54, and the anodic electrode connects to a lead pin 42 via power-feeding bonding wires 34, 35.

Circuit composition is shown in FIG. 11. One of the main differences from the first embodiment exists in that diode polarity of the optical modulator element 51 is reversed. This makes it possible, even with a positive power supply, to apply an inverse bias to the optical modulator element 51. The present second embodiment produces a new effect in that it is possible to realize the optical transmission module that can operate on +5.0-V power only.

According to the above construction of the present second embodiment, similarly to that of the first embodiment, characteristics suitable for an optical transmission module with a driving impedance of 50 Ω can be obtained by changing an element capacity (Cmod) of the optical modulator element 51 to 0.4 pF, inductance L31 of the first bonding wire to 0.4 nH, inductance L32 of the second bonding wire to 0.8 nH, and termination resistance value R24 to 50 Ω. Furthermore, characteristics suitable for an optical transmission module with a driving impedance of 25 α can be obtained by adding the third bonding wire 33 and changing its inductance L33 to 1.2 nH.

In the present embodiment, radio-frequency characteristics (S11, S21, chirp parameters, and others) can also be analyzed with a 50-Ω evaluation system before the third bonding wire is connected. There is the advantage that after the measurements, chip-on-carrier characteristics can be screened/classified with a normal 50-Ω measuring system by adding the third bonding wire 33 and conducting modifications into a 25-Ω driving chip-on-carrier.

Thus, according to the present embodiment, an optical transmission module that can maintain high transmission waveform quality for a driving impedance of 25 Ω can be provided by adding one bonding wire to a circuit designed for a driving impedance of 50 Ω. The addition also makes it possible to provide an optical transmission module that contains a CAN-type package with a single power supply.

According to the present embodiment, it is possible to provide an optical transmission module that can maintain high transmission waveform quality at a driving impedance of 25 Ω using a modulator designed for a driving impedance of 50 Ω. Furthermore it is possible to provide an optical transmission module that contains a CAN-type package that has high transmission waveform quality.

We claim:

1. An optical module comprising:
   an optical modulator element that modulates laser light by use of input electrical signals;
   an input electrode for the input electrical signals;
   a termination resistance element for impedance matching;
   a first bonding wire that connects said input electrode and said optical modulator element; and
   a second bonding wire that connects said optical modulator element and said termination resistance element;
   wherein said input electrode and said termination resistance element are further connected by a third bonding wire.

2. The optical module according to claim 1, further including a package in which a coaxial line in said module has an impedance of 20 Ω or 30 Ω, wherein:
   a resistance value of said termination resistance element is included in a range from 40 Ω to 60 Ω.

3. The optical module according to claim 2, further including a driving IC that outputs the input electrical signals, wherein:
   an output impedance of said driving IC is included in a range from 20 Ω to 30 Ω.

4. An optical module comprising:
   a semiconductor chip into which a laser diode element that outputs laser light, and an optical modulator element that modulates laser light by use of input electrical signals are integrated;
   an input electrode for the input electrical signals; and
   a termination resistance element for impedance matching;
   wherein said module further includes:
   a first bonding wire that connects said input electrode and said optical modulator element;

a second bonding wire that connects said optical modulator element and said termination resistance element; and a third bonding wire that connects said input electrode and said termination resistance element.

5. The optical module according to claim 4, further including a package in which a coaxial line in said module has an impedance of 20 Ω or 30 Ω, wherein:

a resistance value of said termination resistance element is included in a range from 40 Ω to 60 Ω.

6. The optical module according to claim 5, further including a driving IC that outputs the input electrical signals, wherein:

an output impedance of said driving IC is included in a range from 20 Ω to 30 Ω.

7. The optical module according to claim 4, further including a driving IC that outputs the input electrical signals, wherein:

an output impedance of said driving IC is included in a range from 20 Ω to 30 Ω.

8. An optical module comprising:

a semiconductor chip into which a laser diode element that outputs laser light, and an optical modulator element that modulates laser light by use of input electrical signals are integrated;

an input electrode for the input electrical signals, said electrode being disposed at one side of said semiconductor chip across an optical axis thereof; and a resistance element disposed at the side opposite to the side at which said input electrode is disposed across the optical axis of said semiconductor chip;

wherein:

said input electrode, said optical modulator element, and said resistance element are connected by one continuous first bonding wire;

said input electrode and said resistance element are further connected by a second bonding wire.

9. The optical module according to claim 8, further including a package in which a coaxial line in said module has an impedance of 20 Ω or 30 Ω, wherein:

a resistance value of said termination resistance element is included in a range from 40 Ω to 60 Ω.

10. The optical module according to claim 9, further including a driving IC that outputs the input electrical signals, wherein:

an output impedance of said driving IC is included in a range from 20 Ω to 30 Ω.

11. The optical module according to claim 8, further including a driving IC that outputs the input electrical signals, wherein:

an output impedance of said driving IC is included in a range from 20 Ω to 30 Ω.

12. The optical module according to claim 1, further including a driving IC that outputs the input electrical signals, wherein:

an output impedance of said driving IC is included in a range from 20 Ω to 30 Ω.

13. An optical module that contains a CAN-type package comprising:

an optical modulator element that modulates laser light by use of input electrical signals;

an input electrode for the input electrical signals; and a termination resistance element connecting to said input electrode and to said optical modulator element for impedance matching;

wherein:

a resistance value of said termination resistance element is included in a range from 40 Ω to 60 Ω; and a reflection coefficient at a frequency of 7.5 GHz is equal to or less than −15 dB.

* * * * *